United States Patent [19]

Houser et al.

[11] Patent Number: 4,884,334
[45] Date of Patent: Dec. 5, 1989

[54] RESONANT STYLUS SUPPORT

[75] Inventors: David E. Houser, Appalachin; Richard J. Morenus, Endwell, both of N.Y.

[73] Assignee: International Business Machines, Corp., Endicott, N.Y.

[21] Appl. No.: 826,203

[22] Filed: Feb. 5, 1986

[51] Int. Cl.[4] ............................................. B23P 19/00
[52] U.S. Cl. ........................................ 29/739; 228/1.1
[58] Field of Search .......................... 72/710; 228/1.1; 403/362; 267/160, 161; 29/739

[56] References Cited

U.S. PATENT DOCUMENTS

| | | | |
|---|---|---|---|
| 2,891,178 | 6/1959 | Elmore | 228/1.1 |
| 2,891,180 | 6/1959 | Elmore | 228/1.1 |
| 3,476,349 | 11/1969 | Smith | 403/362 |
| 3,752,380 | 8/1973 | Shoh | 228/1.1 |
| 3,804,472 | 4/1974 | Schuller et al. | |
| 4,054,330 | 10/1977 | Luo | |
| 4,499,772 | 2/1985 | Haas | 267/160 |
| 4,582,239 | 4/1986 | Scotto | 228/1.1 |

FOREIGN PATENT DOCUMENTS

| | | |
|---|---|---|
| 0211439 | 2/1987 | European Pat. Off. |
| 490959 | 5/1975 | U.S.S.R. |
| 2111759 | 7/1983 | United Kingdom |

OTHER PUBLICATIONS

Article Entitled: "New Multiwire Meets the Challenge of Interconnecting Chip Carriers", *Electronics*, 12/20/79, pp. 117-121.

*Primary Examiner*—Lowell A. Larson
*Attorney, Agent, or Firm*—Perman & Green

[57] ABSTRACT

Flexure means are provided for holding a tip member of an ultrasonically reciprocating element against lateral movement while freely permitting its longitudinal movement. The reciprocating element is held fixed at a nodal point distant from the tip member. The flexure means having a natural frequency substantially the same as the reciprocating element so as to resonate in concert therewith. In one embodiment, a flexible disc fixed around its periphery is centrally pierced to receive and engage the reciprocating element. In another embodiment, a plurality of elongated resonant supports are mounted at spaced radial positions on a fixture provided with a central opening through which the reciprocating element extends so that free ends of the resonant supports are directed at and engage the reciprocating element. In this embodiment, at least two of the resonant supports are adjustable toward and away from the longitudinal axis of the reciprocating element so as to properly position it. Also, at least one other of the resonant supports is biased into engagement with the reciprocating element thereby holidng the reciprocating element against the ends of the other resonant supports.

13 Claims, 2 Drawing Sheets

RESONANT STYLUS SUPPORT

BACKGROUND OF THE INVENTION

I. Field of the Invention

The present invention relates to a construction for supporting the tip member of an ultrasonically reciprocating or vibrating element using flexure supports which are resonantly tuned to the frequency of the reciprocating element.

II. Description of the Prior Art

The invention has application in any construction in which an unattached end of an ultrasonically reciprocating or vibrating elongated member is to be positioned laterally but permitted the greatest possible freedom of movement in the longitudinal direction. A typical form of construction previously used is disclosed in USSR Patent No. 490,959 which discloses a slide member mounted to a frame by means of resilient element in the form of closed oval strip springs joined respectively to the slide member and the frame. Upon gradual movement of the slide member relative to the frame, the resilient elements roll relative to the frame and the slide member. The range of movement of the slide member is said to be about half the straight line surface length of the resilient elements. However, the slide member is attached to the resilient elements thereby reducing its freedom of motion. Furthermore, the slide member is not intended to be moved ultrasonically and there is no consideration given in the patent to making the resilient elements resonate in harmony with the slide member.

A specific application for the invention resides in its use in combination with a wiring or wire embedding machine for producing encapsulated circuit boards, or ECBs. An example of such a machine is Multiwire® 2000 Series Wiring Machine manufactured by the Electronic Equipment Division of Kollmorgen Corporation of Melville, N.Y. A machine of this type utilizes an ultrasonically vibrating stylus to embed insulated copper wires on an adhesive coated substrate to form a circuit board. The wire is advanced under and through a grooved tip of the stylus which serves to locate the wire for placement on the circuit board. The tip of the stylus vibrates vertically at approximately 25K hertz to cause the adhesive under the wire to melt thereby affixing the wire to the substrate. The stylus is supported in a fixed fashion at a nodal point and a toughened plastic bushing is used to support the stylus at the tip end.

Required machining tolerances for the bushing and for the tip member of the stylus, in addition to a requirement to minimize the damping of the stylus, result in a necessary amount of "play" between the stylus tip and the internal diameter of the bushing. This play increases as the bushing wears and is undesirable because it contributes to misregistration of the wire as it is placed on the surface of the circuit board. One possible solution to the problem might be to replace the bushing which serves as a journal bearing with an anti-friction bearing provided with preloaded balls or rollers. However, such an attempted solution would fail because of the extremely high bidirectional speeds and attendant accelerations and decelerations involved. To generate the high accelerations required by the rolling elements would require preloads between the rolling elements and the stylus tip so high that they would cause excessive contact stresses between the rolling elements and the stylus tip.

SUMMARY OF THE INVENTION

It was with knowledge of the prior art and the problems existing which gave rise to the present invention. According to the invention, flexure means are provided for holding a tip member of an ultrasonically reciprocating element against lateral movement while freely permitting its longitudinal movement. The reciprocating element is held fixed at a nodal point distant from a tip member. The flexure means have a natural frequency substantially the same as the reciprocating element so as to resonate in concert therewith. In one embodiment, a flexible disc fixed around its periphery is centrally pierced to receive and engage the reciprocating element. In another, and preferred, embodiment, a plurality of elongated resonant supports are mounted at spaced radial positions on a fixture provided with a central opening through which the reciprocating element extends so that free ends of the resonant supports are directed at an engage reciprocating element. In this embodiment, at least two of the resonant supports are adjustable toward and away from the longitudinal axis of the reciprocating element so as to properly position it. Also, at least a third of the resonant supports is biased into engagement with the reciprocating element thereby holding the reciprocating element against the ends of the other resonant supports.

In contrast to the tendency of the prior art to dampen vibrations where they exist, or to attempt to eliminate vibrations wherever they occur, the present invention allows unrestricted vibration of a supported member by supporting it with members that have the same natural frequency as the supported member. This minimizes the loading on the supported member because the supporting members "want" to vibrate in the same way that the supported member vibrates.

Other benefits of the invention include its low mass construction and adjustability.

Other and further features, objects, advantages, and benefits of the invention will become apparent from the following description taken in conjunction with the following drawings. It is to be understood that both the foregoing general description and the following detailed description are exemplary and explanatory but not restrictive of the invention. The accompanying drawings which are incorporated in, and constitute a part of this invention, illustrate some of the embodiments of the invention and, together with the description, serve to explain the principles of the invention in general terms.

DESCRIPTION OF THE PREFERRED EMBODIMENTS

Figure 1:
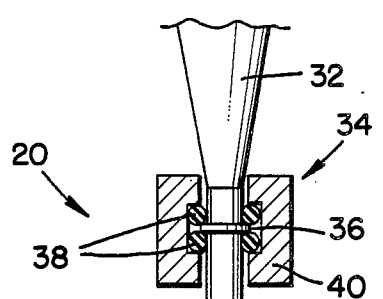
FIG. 1 is a diagrammatic side elevation view certain parts being shown in section, illustrating a part of a prior art ECB wiring machine.
Figure 2:
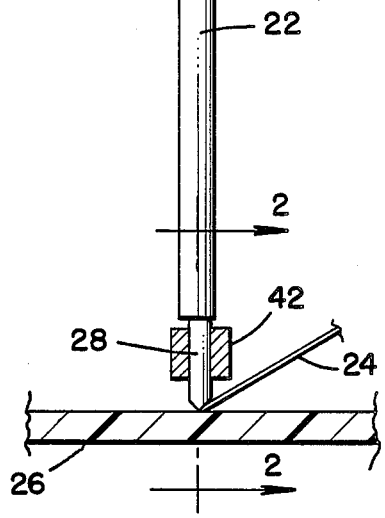
FIG. 2 is a cross section view taken generally along line 2—2 in FIG. 1.

Turn now to the drawings and initially to FIG. 1 which illustrates in a diagrammatic form an operating head 20 for an ECB wiring machine of a type commonly used. The operating head 20 utilizes an ultrasonically vibrating stylus 22 to embed insulated copper wire 24 to an adhesive coated substrate 26 to form a circuit board. As seen in FIGS. 1 and 2, the wire is fed or advanced under a tip member 28 which is formed with a groove 30 at its extreme end for locating the wire on the substrate 26. As illustrated, the tip member 28 has a diameter which is reduced from that of the remainder of the stylus 22. The tip member 28 is of a reduced diameter because it is made from a different material (for example, tungsten carbide) than the rest of the stylus to provide wear resistance. The smaller diameter tip member 28 may be attached to the larger diameter stylus 22 by brazing it into a hole in the end of the larger member. Also the small diameter enables the mechanism (not shown) that presents the wire to the tip member to be as close to the centerline of the stylus as possible to prevent the wire from coming out of the groove 30 in the tip member especially as the stylus negotiates turns as it proceeds across the surface of the substrate.

A drive shaft 32 integral with an upper end of the stylus 22 is operatively connected to a suitable vibrating mechanism (not shown). The vibrating mechanism vibrates the stylus 22 in a vertical direction, or along a longitudinal axis of the stylus. Typically, the tip of the stylus 22 vibrates through a range of linear distance of approximately 0.002 inches and at a frequency of 25K hertz. This vibration causes the adhesive on the surface of the substrate 26 beneath the wire to melt thereby affixing the wire to the substrate 26.

The stylus 22 is mounted to the wiring machine by means of an upper support 34 positioned at a nodal point of the stylus, that is, at a point of zero movement or deflection. Cooperating with the upper support 34 is an annular flange 36 integral with the stylus 22. The flange 36 is straddled by a pair of tight fitting o-rings 38 which, in turn, are held tightly in engagement with the annular flange 36 by means of a suitable clamping member 40.

At a lower end of the stylus 22, namely at its tip member 28, a wear resistant plastic bushing 42 mounted to the wiring machine serves to position and hold the tip member 28 so as to properly locate the wire 24 on the substrate 26. The bushing 42 has typically been composed of a tough material such as that manufactured by Dixon Industries Corporation of Bristol, R.I. under the trademark "Rulon".

Figure 3:
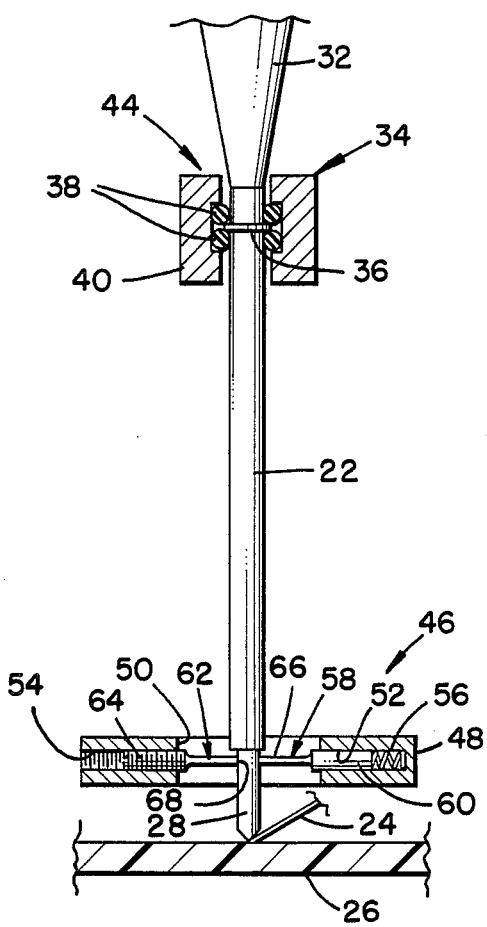
FIG. 3 is a side elevation view, illustrating the structure of FIG. 1 modified in accordance with the invention.
Figure 4:
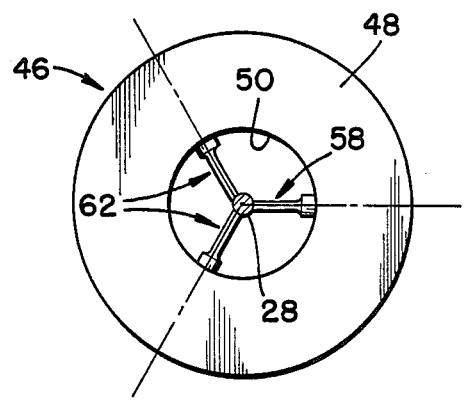
FIG. 4 is a bottom plan view of the construction of illustrated in FIG. 3.

According to the invention, however, and as particularly seen in FIGS. 3 and 4, a modified operating head 44 replaces the bushing 42 of the operating head 20 with a flexure support 46. In all other respects, the operating 44 is similar to the operating head 20.

With continuing reference to FIGS. 3 and 4, the flexure support 46 is seen to include a fixture 48 suitably mounted to the machine. The fixture 48 may be of donut shape as illustrated, or of some other suitable shape which accommodates the goals of the invention. As illustrated, the fixture 48 is provided with a central opening 50 through which the tip member 28 extends, the fixture 48 being spaced above an upper surface of the substrate 26. The fixture 48 is formed with at least one smooth radial bore 52 and at least a pair of tapped or threaded radially directed bores 54. The bore 52 is blind and receives therein a compression spring 56 at its inner end. A first resonant support 58 includes a mounting portion 60 having a smooth outer surface adapted to be slidably received within the bore 52.

Second and third resonant supports 62 are identically formed and threadedly received within the radial bores 54. The resonant supports 62 are similar to the support 58 except that they have an externally threaded mounting portion 64 in place of the smooth mounting portion 60 of the support 58. All of the resonant supports 58 and 62 have thinner regions 66 and free ends 68. The free ends 68 of the resonant supports 62 serve to engage the tip member 28 and properly position it relative to the substrate 26. The free end of the resonant support 58 is biased into engagement with the tip member 28 by means of the spring 56 thereby serving to hold the tip member 28 in engagement with the free ends of the resonant supports 62. It will be appreciated that in order for the flexure 46 to be effective, the subtended angles between the resonant support 58 and each of the resonant supports 62 must be obtuse or greater than 90 degrees.

The resonant supports 58 and 62 have thinner regions 66 to improve their flexability. A preferred material out of which the resonant support 58 and 62 are fabricated is tool steel hardened to a Rockwell "C" hardness lying in the range of 58 to 62.

As is known, frequency of a vibrating cylindrical, cantilevered member is a function of its diameter length, material stiffness, and material density. For purposes of the invention, values of parameters are chosen so that the resonant supports 58 and 62 exhibit a natural frequency which is substantially equivalent to that of the stylus 22. In this manner, the free ends 68 move in unison with the tip member 28 and resonate in concert with the stylus 22.

With respect to the embodiment illustrated in FIGS. 3 and 4, three resonant supports are preferred since that construction represents the simplest design which will be effective to properly position the stylus 22 and maintain that position during operation. Additional resonant supports 58 or 62 can be utilized, but the construction and operation of the flexure support 46 would thereby become substantially more complex than the construction illustrated and described. The embodiment of FIGS. 3 and 4 is thus preferred because it accomplishes the desired goals of the invention with a minimum of structural mass and complexity while assuring the proper placement and support needed for the tip member 28. However, it will be appreciated that there are numerous other constructions which can be utilized and still remain within the scope of the invention.

Figure 5:
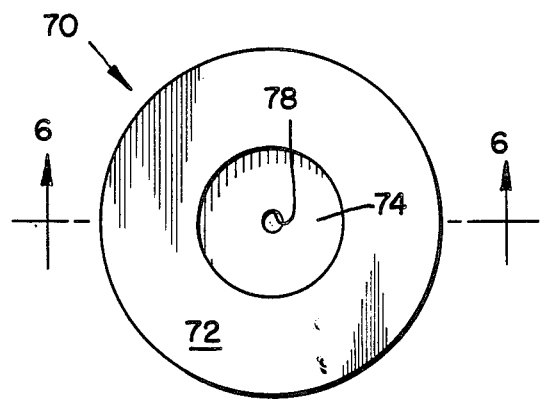
FIG. 5 is a bottom plan view similar to FIG. 4, illustrating another embodiment of the invention.
Figure 6:
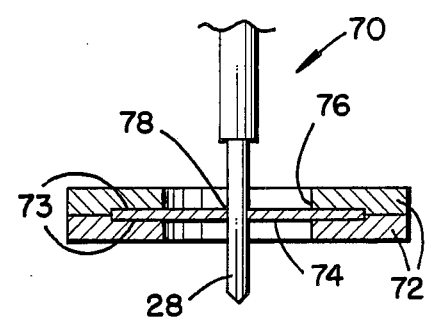
FIG. 6 is a cross section view taken generally along line 6—6 in FIG. 5.

For a description of another embodiment, turn now to FIGS. 5 and 6. In this embodiment, a flexure support structure 70 includes a pair of ring-like fixtures 72 which are suitably mounted to the machine and which are formed with appropriate cutouts 73 to fittingly receive a flexible resonant disc support 74 therebetween. When the fixtures 72 are clamped together in a suitable fashion, they firmly hold the resonant disc support 74 in place so as to extend across a central opening 76 which extends through each of the fixtures 72. The disc support is perforated so as to define an inner rim 78 which fittingly engages the tip member 28 as it extends through the central opening 76. As with the resonant supports 58 and 62, the flexible disc support 74 serves to laterally position the stylus 22 but moves longitudinally with the stylus. Additionally, the appropriate parameters for the disc support 74 are chosen to assure that it has a natural frequency substantially the same as that of the stylus so as to resonate in concert with the stylus as the stylus vibrates.

While various embodiments of the invention had been shown and described it will be appreciated that other structural modification may be made without departing from the spirit of the invention or the scope of the invention as defined in the appended claims.

We claim:

1. In a wire embedder machine including an elongated stylus terminating at a tip member adapted to engage and apply to an adhesive coated substrate a wire in the course of producing an encapsulated circuit board, drive means for vibrating said stylus at a constant ultrasonic frequency along a longitudinal axis, and a support holding said stylus fixed at a nodal point thereof distant from said tip member, the improvement comprising:

flexure means mounted on said machine engageable with said stylus at said tip member to restrain said stylus against lateral movement while freely permitting longitudinal movement thereof as said stylus moves along its longitudinal axis, said flexure means having a natural frequency substantially the same as said stylus so as to resonate in concert therewith.

2. The improvement as set forth in claim 1 wherein said stylus moves a distance of approximately 0.002 inches and at a frequency of approximately 25 k hertz as it vibrates.

3. The improvement as set forth in claim 1 wherein said tip member is formed with a groove at its extreme end for slidably receiving and guiding the wire onto the substrate.

4. The improvement as set forth in claim 3 wherein said tip member is a coaxial extension of said stylus and has a cross sectional area reduced from the remainder of said stylus.

5. The improvement as set forth in claim 3 wherein said flexure means includes:
a fixture having an opening through which said tip member extends;
a plurality of elongated resonant supports, each of said resonant supports mounted on said fixture at one end and including a free end extending into the opening toward the longitudinal axis of said stylus, said free end being engageable with the outer surface of said tip member.

6. The improvement as set forth in claim 5 wherein said resonant supports lie in a plane transverse to the longitudinal axis of said stylus at spaced radial positions around said tip member.

7. The improvement as set forth in claim 5 wherein said resonant supports lie in a plane perpendicular to the longitudinal axis of said stylus at spaced radial positions around said tip member.

8. The improvement as set forth in claim 5 wherein said flexure means includes adjustment means for locating said free end of at least one of said resonant supports relative to said tip member.

9. The improvement as set forth in claim 5 wherein said flexure means includes resilient means for biasing said free end of at least one of said resonant supports toward said tip member.

10. The improvement as set forth in claim 2 wherein said flexure means includes:
a fixture having an opening through which said tip member extends;
at least a first elongated resonant support mounted on said fixture at one end including a free end extending into the opening toward the longitudinal axis of said stylus;
resilient means on said fixture biasing said first elongated resonant support toward said stylus;
at least second and third elongated resonant supports mounted on said fixture at one end, each including a free end extending into the opening toward the longitudinal axis of said stylus, said resonant supports assuming spaced radial positions around said stylus;
all of said resonant supports lying in a plane perpendicular to the longitudinal axis of said stylus;
each of said second and third resonant supports forming an obtuse angle with said first resonant support;
said flexure means including adjustment means for locating said free ends in engagement with said tip member such that said tip member is aligned with the longitudinal axis of said stylus;
resilient means on said fixture biasing said free end of said first resonant support into engagement with said tip member and thereby holding said tip member in engagement with said free ends of said second and third resonant members;
such that said free ends of said resonant supports move in unison with said stylus and resonate in concert therewith.

11. The improvement as set forth in claim 10 wherein said fixture has
at least a first blind radial bore therein communicating with the opening; and
a compression spring received in said first radial bore;
wherein said first resonant support includes
a mounting portion opposite said free end slidably received in said first radial bore; and
wherein said fixture has
at least second and third radial bores therein communicating with the opening, said second and third radial bores being tapped; and
wherein each of said second and third resonant supports include a threaded mounting portion opposite said free end threadedly engaged with said second and third bores, respectively;
whereby rotation of said second and third resonant supports within said second and third radial bores moves said free ends thereof relative to said stylus.

12. The improvement as set forth in claim 2 wherein said flexure means includes:
a fixture having an opening through which said tip member extends;
a flexible disc mounted on said fixture and extending across the opening, said disc being perforated to define an inner rim fittingly engaged with said tip member;
such that said rim of said disc moves in unison with said stylus and resonates in concert therewith.

13. An apparatus including an elongated reciprocating element having a tip member and drive means for vibrating said tip member at a constant ultrasonic frequency along a longitudinal axis, the improvement comprising:
a support holding said reciprocating element fixed at a nodal point thereof distant from said tip member; and flexure means mounted on said apparatus engageable with said reciprocating element at said tip member to rest rain sa id reciprocating element against lateral movement while freely permitting longitudinal movement thereof as said reciprocating element moves along its longitudinal axis, said flexure means having a natural frequency substantially the same as said reciprocating element so as to resonate in concert therewith.

* * * * *